US006370636B1

(12) United States Patent
Park

(10) Patent No.: US 6,370,636 B1
(45) Date of Patent: Apr. 9, 2002

(54) ACCESSING BYTE LINES FROM DUAL MEMORY BLOCKS AND ALIGNING FOR VARIABLE LENGTH INSTRUCTION EXECUTION

(75) Inventor: Soung-Hwi Park, Busan (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/722,028

(22) Filed: Nov. 27, 2000

Related U.S. Application Data

(63) Continuation-in-part of application No. 09/026,554, filed on Feb. 20, 1998, now abandoned, and a continuation-in-part of application No. 09/870,297, filed on Jun. 6, 1997, now Pat. No. 5,875,147.

(30) Foreign Application Priority Data

Jul. 31, 1996  (KR) ............................................. 96-31642
Mar. 4, 1997  (KR) ............................................. 97-6987

(51) Int. Cl.[7] ................................................ G06F 9/30
(52) U.S. Cl. ...................................... 712/204; 712/210
(58) Field of Search .................................. 712/204, 210

(56) References Cited

U.S. PATENT DOCUMENTS

| 4,530,050 A | | 7/1985 | Fukunaga et al. ........... 712/210 |
| 4,654,781 A | * | 3/1987 | Schwartz et al. ............ 711/219 |
| 4,847,759 A | * | 7/1989 | Oklobdzija .................... 710/53 |
| 5,138,705 A | | 8/1992 | Lo et al. ......................... 711/2 |
| 5,226,129 A | | 7/1993 | Ooi et al. ..................... 712/204 |
| 5,353,427 A | | 10/1994 | Fujishima et al. .......... 711/118 |
| 5,367,495 A | | 11/1994 | Ishikawa ..................... 365/239 |
| 5,426,743 A | | 6/1995 | Phillips et al. ............... 712/221 |
| 5,448,746 A | | 9/1995 | Eickemeyer et al. ........ 712/210 |
| 5,522,053 A | | 5/1996 | Yoshida et al. .............. 711/213 |
| 5,542,059 A | | 7/1996 | Blomgren ..................... 712/41 |
| 5,559,975 A | | 9/1996 | Christie et al. ............. 712/230 |
| 5,561,784 A | | 10/1996 | Chen et al. .................. 711/157 |
| 5,625,784 A | * | 4/1997 | Purcell ........................ 712/210 |
| 5,634,038 A | | 5/1997 | Saitoh ......................... 711/163 |
| 5,845,100 A | * | 12/1998 | Gupta et al. ................. 712/204 |
| 5,867,696 A | | 2/1999 | Okayama et al. ........... 712/233 |

OTHER PUBLICATIONS

Intel 80960CA Product Overview (Sep. 1989), pp. 3–187.

* cited by examiner

Primary Examiner—Kenneth S. Kim
(74) Attorney, Agent, or Firm—Fleshner & Kim, LLP

(57) ABSTRACT

A data access circuit for a CPU that individually extracts and processes variable length data or commands from a memory in one clock period provides high speed processing. The circuit includes a program counter for increasing a previous address by a currently decoded command length to compute the next address. The program counter outputs the next address to a data storing unit and a data alignment unit. The data storing unit can include two memories with two decoders and outputs a prescribed length of data corresponding to the next address from the program counter. The data alignment unit aligns the prescribed amount of data output from the data storing unit using the next address. A command decoding unit decodes the aligned data in order to determine a next command and its variable command length, which is used to reset the currently extracted command length used by the program counter. A command execution unit executes the next command received from the command decoding unit.

21 Claims, 5 Drawing Sheets

| INPUT ADDRESS | | | SELECTION SIGNAL FOR DE-MULTIPLEXER HAVING TWO INPUTS | | | | SELECTION SIGNAL FOR DE-MULTIPLEXER HAVING FOUR INPUTS | |
|---|---|---|---|---|---|---|---|---|
| A2 | A1 | A0 | S0 | S1 | S2 | S3 | SU1 | SU0 |
| 0 | 0 | 0 | 0 | 0 | 0 | 0 | 0 | 0 |
| 0 | 0 | 1 | 1 | 0 | 0 | 0 | 0 | 1 |
| 0 | 1 | 0 | 1 | 1 | 0 | 0 | 1 | 0 |
| 0 | 1 | 1 | 1 | 1 | 1 | 0 | 1 | 1 |
| 1 | 0 | 0 | 1 | 1 | 1 | 1 | 0 | 0 |
| 1 | 0 | 1 | 0 | 1 | 1 | 1 | 0 | 1 |
| 1 | 1 | 0 | 0 | 0 | 1 | 1 | 1 | 0 |
| 1 | 1 | 1 | 0 | 0 | 1 | 1 | 1 | 1 |

ACCESSING BYTE LINES FROM DUAL MEMORY BLOCKS AND ALIGNING FOR VARIABLE LENGTH INSTRUCTION EXECUTION

This application is a continuation-in-part of prior application Ser. No. 09/026,554 filed Feb. 20, 1998 now abandoned and a continuation-in-part of prior application Ser. No. 09/870,297 filed Jun. 6, 1997 (now Pat. No. 5,875,147). The entire disclosure of the prior applications are considered as being part of the disclosure of the accompanying application and are hereby incorporated by reference therein.

BACKGROUND OF THE INVENTION

1. Field of the Invention

The present invention relates to a data access circuit for a Central Processing Unit (CPU).

2. Background of the Related Art

FIG. 1 illustrates a related art data access circuit for a Central Processing Unit (CPU). The related art data access circuit for a CPU includes a program counter 110 for constantly increasing addresses for a command extraction, a memory 120 for outputting a data corresponding to the output address from the program counter 110, a command decoder 130 for decoding the output data from the memory 120 and a command execution unit 140 for executing the decoded command from the command decoder 130.

When a program is executed, the program counter 110 increases addresses for command extraction from a predetermined address level by counting a clock signalCLK and outputs the increased addresses to the memory 120. When the memory 120 outputs the data corresponding to a region designated by an output address from the program counter 110, the command decoder 130 decodes the data to a command. The command execution unit 140 executes the commands decoded by the command decoder 130, and at the same time the program counter 110 increases the previous addresses by counting the clock signal CLK. The program counter 110 increases the previous address by a predetermined amount. Then, the program counter 110 outputs the increased address to the memory 120. When the memory 120 again outputs the data corresponding to the output address of the program counter 110, the commands are executed through the command decoder 130 and the command execution unit 140 in the above-described operation.

The related art CPU can be classified into a CISC structure and an RISC structure. Corresponding pipe line structures for CISC and RISC as shown in FIGS. 2 and 3 are configured to perform a fetch step F for reading a command, a decoding step D for interpreting the read command, an execution step E for executing the interpreted command, and a write back step WB for storing the executed result.

In the CISC structure CPU, since the command structure is configured by various lengths, not with a fixed length, it is possible to express complicated commands as one command. However, as shown in FIG. 2, a one word command is read at one clock period, and a two word command is read in two clock periods. Thus, a multi-word command is read in a few clock periods to execute a corresponding command.

As shown in FIG. 3, since the RISC structure CPU is configured to process commands each having the same length, it is possible to read the commands at one clock period. Since each command is read at one clock period, the command processing is very simply performed. Thus, a high speed processing is enabled as compared to the CISC structure.

However, the related art data access circuits have various disadvantages. In the related art data access circuits, it is possible to execute a complicated program by using one command because the commands of the CISC structure CPU have various lengths. However, when reading the CISC commands having shorter lengths and the commands having longer lengths, the command extraction time is different. In this case, the command reading and processing operations are complicated, the system performance is degraded, and a command processing speed is reduced.

The RISC structure CPU is configured to process commands having a predetermined length. Further, the RISC structure CPU reads commands at one time. Thus, the RISC structure CPU overcomes the disadvantages of the CPU of the CISC structure. However, since the lengths of the commands are identical and there is a predetermined limit for configuring the command processing system, it is impossible to execute the complicated commands by using one command. Thus, the code conversion efficiency of the RISC structure CPU is degraded.

A conventional decoder for the semiconductor memory device will now be described. FIG. 4 is a block diagram showing a conventional decoder system for a semiconductor memory device. Generally, a semiconductor memory device uses memory elements and a decoder for selecting memory words, together with memory cells, designated by input addresses. The conventional semiconductor memory device includes "mxn" binary memory cells 2 for accommodating "m" words of "n" bits, and an address decoder 1 for selecting each word. Each binary memory cell is a basic design block of the semiconductor memory device.

Two address inputs are connected to the address decoder 1, which is operated by a memory enable signal. If the memory enable signal sent to the address decoder 1 is "0", the output of the address decoder 1 becomes "0" so that no word can be selected. If a memory enable signal sent to the address decoder 1 is "1", one of four words is selected according to the value of the two address inputs. Thus, in the conventional semiconductor device, if the address decoder 1 receives an address, memory cells of many bytes on the designated row are simultaneously accessed. In this case, if a reading/writing signal is "1", storage values of a binary memory cell 2 on designated words pass through three OR gates and are produced through output ports. Since other binary memory cells 2 generate "0", they don't affect the output. If the reading/writing signal is "0", information standby at an input port is stored in a binary memory cell 2 on a designated word.

As described above, the conventional semiconductor memory device has various disadvantages and problems. The conventional semiconductor device only provides accessibility to the memory cells on a designated row upon receiving an address in an address decoder. It cannot provide continuity in input of addresses. Therefore, if when storing data with lengths and addresses over two rows, since the semiconductor memory device operates in divided steps for each of the rows, the operation speed is very low.

SUMMARY OF THE INVENTION

An object of the present invention to provide a semiconductor device data access circuit and method that overcomes at least the problems and disadvantages of the related art.

Another object of the present invention is to provide an address alignment system that can access many bytes of continued memory cells for any selected address.

Another object of the present invention is to provide an address alignment system that can access many variable length instruction/data for an input address.

Another object of the present invention is to provide an address alignment system that can access many variable length instruction/data for an input address in a single clock period.

Another object of the present invention to provide a data access circuit and method for a CPU that processes various length commands at high speed and one at a time.

Another object of the present invention is to provide a data access circuit and method that extracts commands irrespective of the corresponding lengths at one time by increasing a program count value as much as the length of the currently extracted command before designating the address of the next command.

To achieve the at least above objects in whole or in part, there is provided a data access circuit for a CPU according to the present invention that includes a program counter that increases a previous address by a length of a currently decoded command to compute the next address. A data storing unit outputs a data of a region corresponding to an output address from the program counter, and a data alignment unit judges the output address from the program counter to sequentially align data output from the data storing unit. A command decoding unit interprets the data from the data alignment unit to output a length value from the interpreted data to the program counter and a decoded command. A command execution unit executes the decoded command from the command decoding unit.

To further achieve the objects in whole or in part, there is provided a data access circuit for a CPU according to the present invention that includes a program counter that computes an output address based on a current command length, a data storage device that outputs data corresponding to the output address from the program counter, a data alignment device that aligns the output data from the data storage device and a decoding device that decodes a current command and a current command length among the aligned data from the data alignment device.

To further achieve the objects in whole or in part, there is provided a data access circuit for a CPU according to the present invention that includes a program counter that modifies a current memory address according to a currently decoded command length and computes a next memory address, a memory array that outputs a prescribed amount of data responsive to the next memory address from the program counter, wherein the prescribed amount of data is not less than a maximum CPU command length, wherein the memory array uses two or more address decoders and two or more memory cell arrays to output the prescribed amount of data at one time, a data alignment device that receives the prescribed amount of data from the memory array and aligns the prescribed amount of data according to the next memory address received from the program counter, a command decoder that decodes a subset of the aligned prescribed amount of data to output a variable length command and its variable command length, wherein the variable command length is transmitted to the program counter as the currently decoded command length, and a command execution device that receives and executes the variable length command from the command decoder.

To further achieve the objects in whole or in part, there is provided a data access circuit for a CPU according to the present invention that includes computing an output address based on a previous command length, outputting a prescribed amount of data from a plurality of data storage devices corresponding to the output address, wherein the prescribed amount of data is not less than a maximum command length, aligning the prescribed amount of data from the data storing device according to the output address, decoding a current command length and a current command in order starting from a front portion among the aligned prescribed amount of data, wherein the current command length is variable, and executing the current variable length command decoded from the aligned data, wherein the output address is recomputed based on the current command length.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
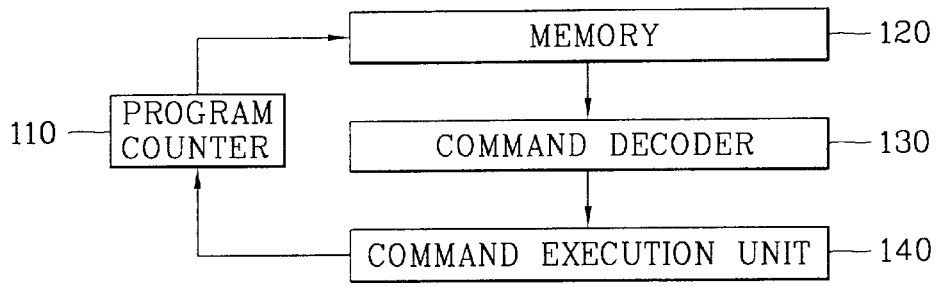
FIG. 1 is a block diagram illustrating a related art data access circuit.
Figure 2:
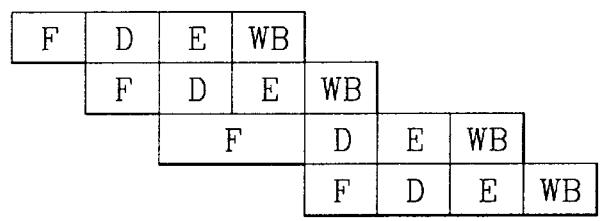
FIG. 2 is a diagram illustrating pipeline processing of a related art CISC structure CPU.
Figure 3:
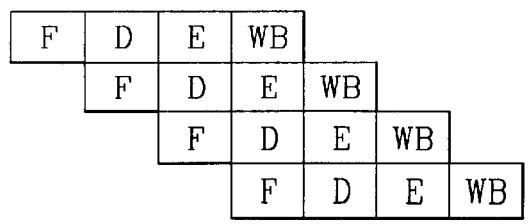
FIG. 3 is a diagram illustrating pipeline processing of a related art RISC structure CPU.
Figure 4:
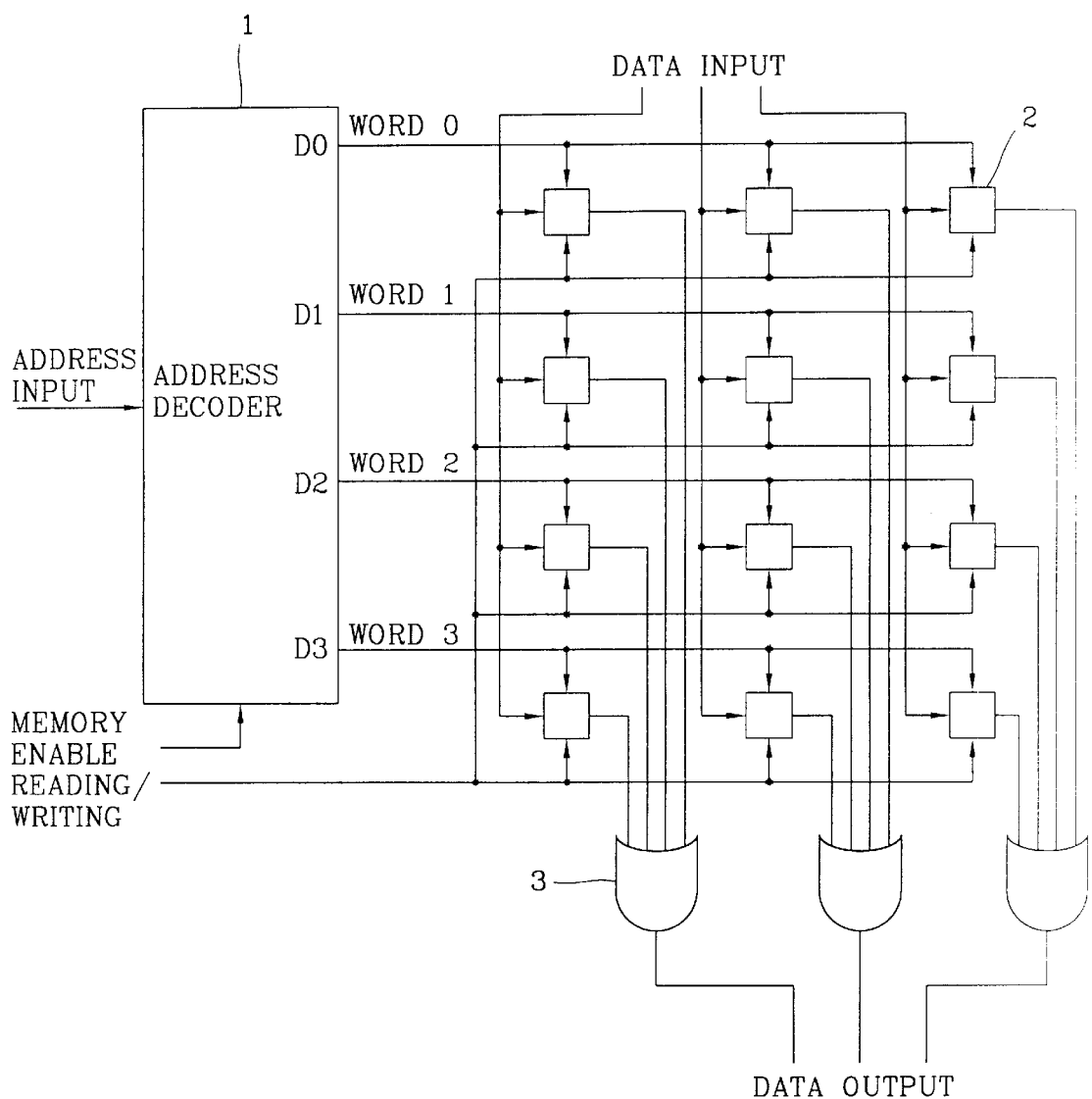
FIG. 4 is a block diagram of a conventional decoder system for a semiconductor device.
Figure 5:
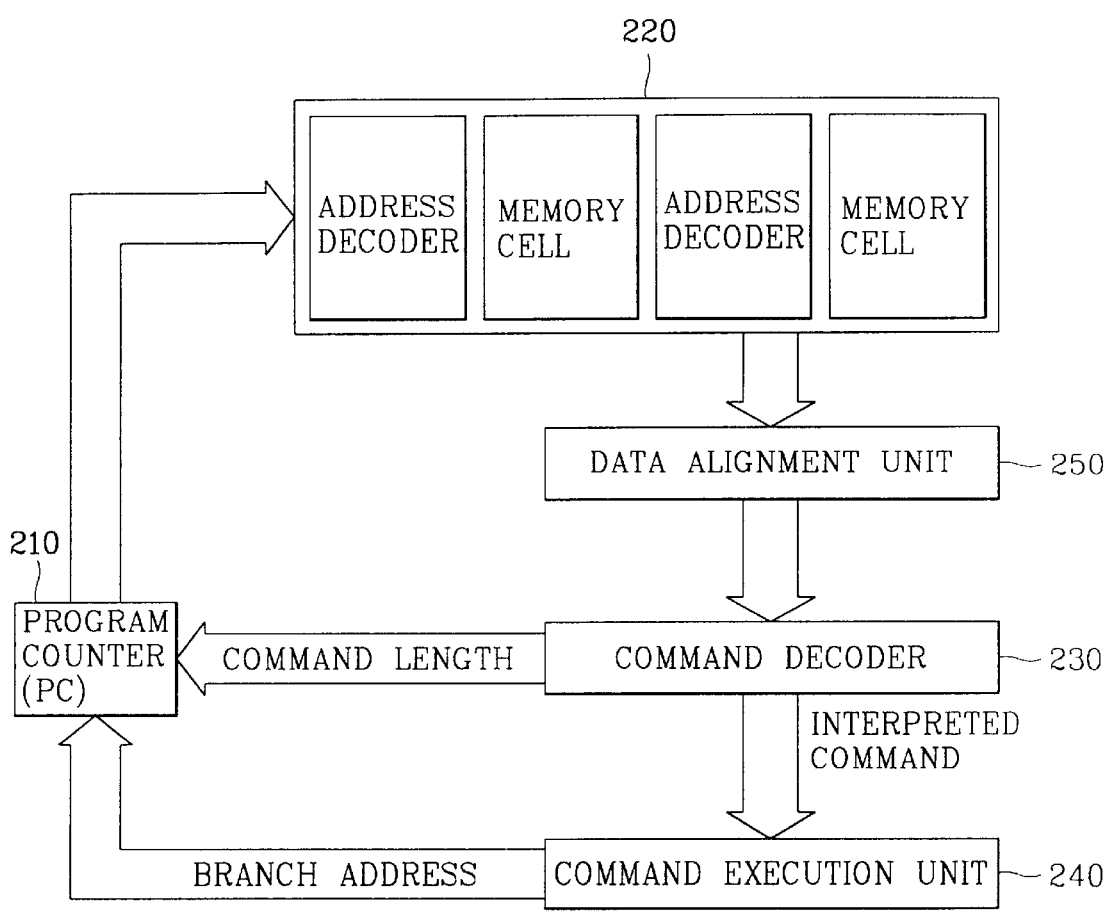
FIG. 5 is a block diagram illustrating one preferred embodiment of a data access circuit according to the present invention.

As shown in FIG. 5, a preferred embodiment of a data access circuit according to the present invention includes a program counter 210, a memory 220, a data alignment unit 250, a command decoder 230 and a command execution unit 240. The program counter 210 computes an (e.g., next) address and outputs the same. The program counter 210 preferably increases a previous address as much as the length of a currently decoded command to compute the next address. The memory 220 outputs data of a region corresponding to the output address from the program counter 210. The data alignment unit 250 sequentially aligns the output data from the memory 220 in accordance with the output address from the program counter 210.

The command decoder 230 interprets only an effective data among the output data from the data alignment unit 250. The command decoder 230 preferably outputs an interpreted data or command to the command execution unit 240 and a length value of the interpreted data or command to the program counter 210. The command execution unit 240 executes a command interpreted by the command decoder 230 and outputs the executed command (e.g., address) to the program counter 210 when a branch address such as a call or a jump is executed.

The memory 220 preferably includes two memory arrays or cells and two address decoders so that the data are output in accordance with the address designated by the program counter 210. The data alignment unit 250 continuously outputs the data from the memory cell of the memory 220 having the address designated by the program counter 210 and the data of the other memory cell of the memory 220. The length of the command is preferably indicated in a portion of the command for extracting the command length and the command by the command decoder 230.

Figure 6:
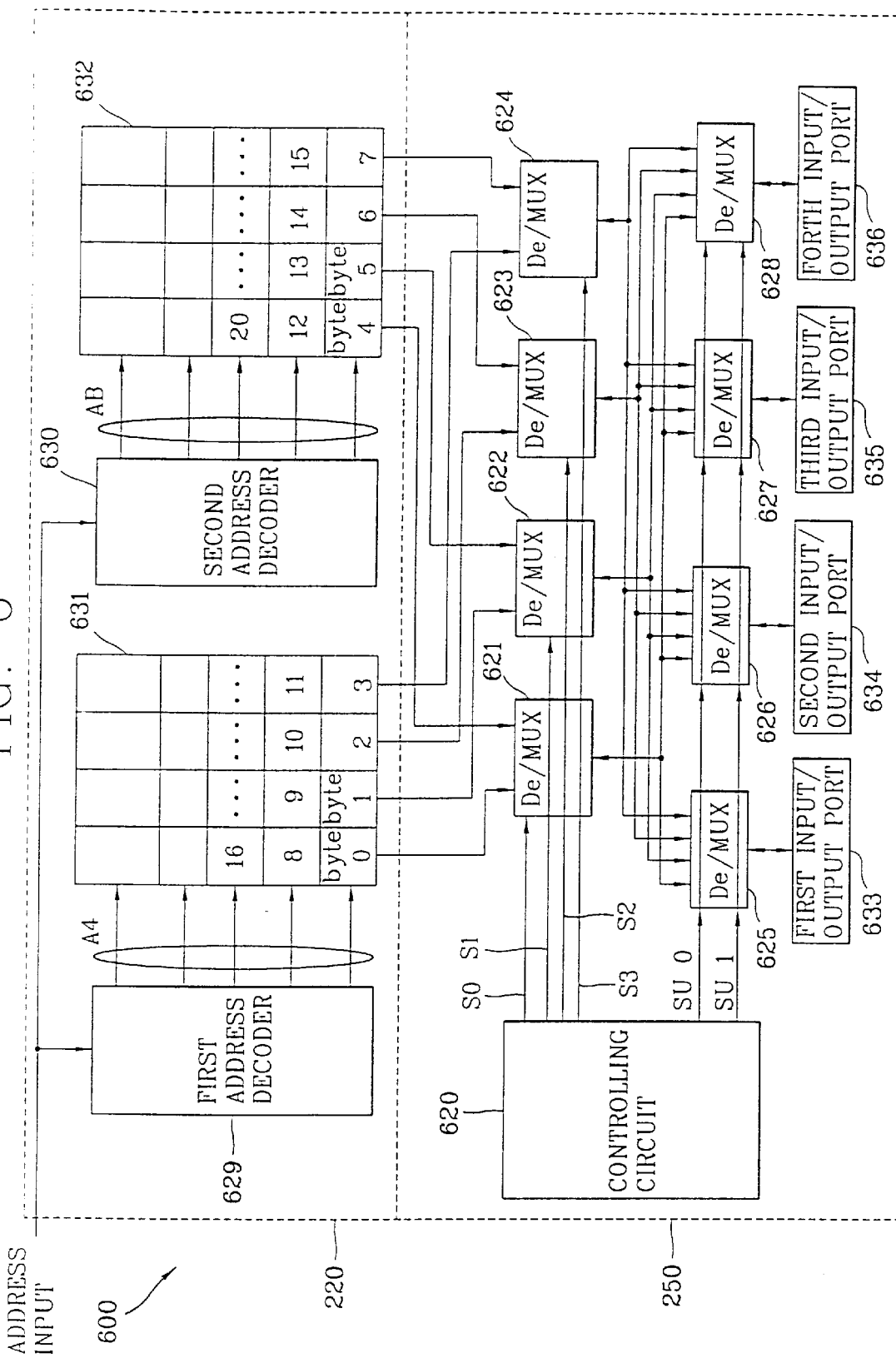
FIG. 6 is a block diagram of an address alignment system in accordance with a preferred embodiment of the present invention.
Figures 7, 8:
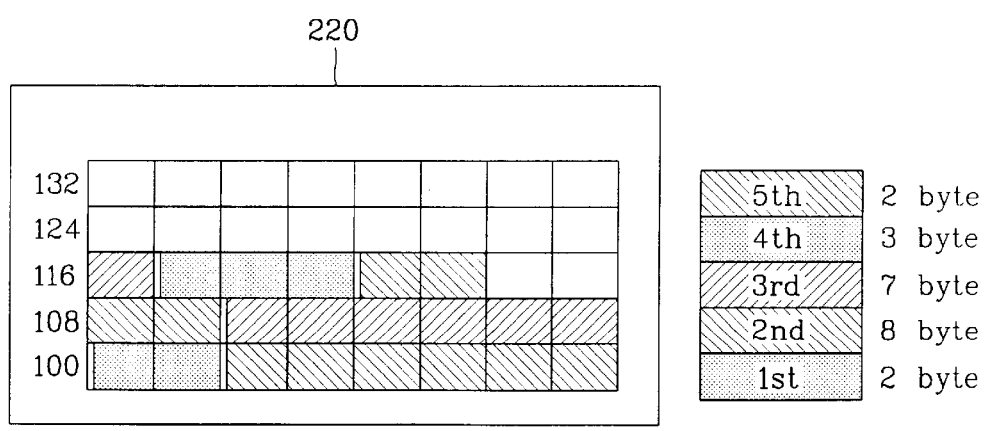
FIG. 7 is a truth table in accordance with operations of the address alignment system of FIG. 6.
FIG. 8 is a diagram illustrating command extraction for the data access circuit of FIG. 5.

FIG. 6 is a block diagram showing an address alignment system of a data access circuit in accordance with a preferred embodiment of the present invention, and FIG. 7 is a truth table in accordance with the operations of the address alignment system of FIG. 6. As shown in FIG. 6, an address alignment system 600 can include the memory 220 and the data alignment unit 250.

In a semiconductor memory device according to the preferred embodiment of the address alignment system according to the present invention, memory cells for storing data are divided into two blocks, each having preferably 4-byte sized input/output. However, the present invention is not intended to be so limited.

The address alignment system 600 includes first and second address decoders 629 and 630 for decoding an address received by the semiconductor memory device. A first memory cell block 631 stores the addresses decoded by the first address decoder 629, and a second memory cell block 632 stores the addresses decoded by the second address decoder 630. A controlling circuit 620 generates data input/output selection signals S0, Si, S2, S3, SU0, and SU1 in accordance with the received addresses. A first two-input demultiplexer 621 is coupled to the first memory cell block 631 and the second memory cell block 632 for selecting a data input/output in response to the data input/output selection signal S0 from the controlling circuit 620. A second two-input demultiplexer 622 is coupled to the first memory cell block 631 and the second memory cell block 632 for selecting a data input/output in response to the data input/output selection signal S1 from the controlling circuit 620. A third two-input demultiplexer 623 is coupled to the first cell memory block 631 and the second cell block 632 for selecting a data input/output in response to the data input/output selection signal S2 from the controlling circuit 620. A fourth two-input demultiplexer 624 is coupled to the first memory cell block 631 and the second memory cell block 632 for selecting a data input/output in response to the data input/output selection signal S3 from the controlling circuit 620. First to fourth four-input demultiplexers 625, 626, 627, and 628 receive and produce cell data in response to the data input/output selection signals SU0 and SU1 from the controlling circuit 620. First to fourth input/output ports 633, 634, 635, and 636 receive and produce data from the first to the fourth four-input demultiplexers 625, 626, 627, and 628, respectively.

Each of the first to the fourth input/output ports 633, 634, 635, and 636 preferably has 8 bytes of data width and can receive/produce a maximum of 32 bits of data simultaneously. However, the present invention is not intended to be so limited.

Operations of the address alignment system 600 according to the preferred embodiment will now be described. First, upon receiving an address for access to a memory cell, the received address is decoded by both the first address decoder 629 and the second address decoder 630. Alternatively, separate addresses based on the received address could be determined and used. Since the address is also received by the controlling circuit 620, the controlling circuit 620 generates data input/output selection signals S0, S1, S2, S3, SU0, and SU1 in accordance with the received address.

Operations of each block in accordance with each address value will be described with reference to FIG. 7. FIG. 7 shows a table of operation values, where a least significant bit (LSB) of the input address A is defined as A0, a second LSB as A1, and a third LSB as A2, etc.

If the received address is "zero," the data input/output selection signals S0, S1, S2, and S3 from the controlling circuit 620 are all "zero" so that the two-input demultiplexers 621, 622, 623, and 624 are all coupled to the first memory cell block 631 in common.

Because the data input/output selection signals SU0 and SU1 also become "zero", the four-input demultiplexers 625, 626, 627, 628 are coupled to the input/output ports 633, 634, 635, and 636, respectively. Accordingly, reception/production of the input/output ports 633–636 are byte 0, byte 1, byte 2, and byte 3, respectively.

If the received address is unity, the data input/output selection signal S0 becomes unity so that the first two-input demultiplexer 621 is coupled to the second memory cell block 632, and the data input/output selection signals S1, S2, and S3 become "zero" so that the second, third, and fourth two-input demultiplexers 622, 623, and 624 are coupled to the first cell block 631. Since the data input/output selection signals SU0 and SU1 are unity and "zero" respectively, the first, second, third, and fourth four-input demultiplexers 625, 626, 627, and 628 are operated such that the input/outputs of the input/output ports 633, 634, 635, and 636 become byte 1, byte 2, byte 3, and byte 4, respectively.

If the received address is 2, the data input/output selection signals S0 and S1 become 1 so that the first and second two-input demultiplexers 621 and 622 are coupled to the second memory cell block 632, and the data input/output selection signals S2 and S3 becomes "zero" so that the third and fourth two-input demultiplexers 623 and 624 are all coupled to the first memory cell block 631. The data input/output signals SU0 and SU1 become 0 and 1, respectively. The first to fourth four-input demultiplexers 625–628 are operated so that the input/output of the first to the fourth input/output 633–636 become byte 2, byte 3, byte 4, and byte 5, respectively.

If the received address is 4, all the data input/output selection signals S0, S1, S2, and S3 become unity so that the first, second, third, and fourth two-input demultiplexers 621, 622, 623, and 624 are coupled to the second memory cell block 632. The data input/output selection signals SU0 and SU1 become "zero". The first, second, third, and fourth four-input demultiplexers 625, 626, 627, and 628 are operated such that the input/outputs of the first, second, third, and fourth input/output ports 633, 634,635, 636 are byte 4, byte 5, byte 6, and byte 7, respectively.

If the received address is 4, 5, 6, or 7, unity is preferably added to the address of the first memory cell block 631 before decoding the received address. For example, if the received address is 6, the address of the first memory cell block 631 becomes byte 8 to byte 11. And, since the data input/output selection signals S0 and S1 become "zero" and the data input/output selection signals S2 and S3 become unity, the first and second two-input demultiplexers 621 and 622 are coupled to the first memory cell block 631, and the third and fourth two-input demultiplexers 623 and 624 are coupled to the second memory cell block 632. Since the data input/output selection signals SU0 and SU1 are "zero" and "one", the first, second, third, and fourth demultiplexers 625, 626, 627, and 628 having four inputs are operated so that the input/outputs of the first, second, third, and fourth input/output ports 633, 634, 635, and 636 become byte 6, byte 7, byte 8, and byte 9, respectively.

Operations and effects of the preferred embodiment of the data access circuit shown in FIG. 5 for a CPU according to the present invention will now be described.

When executing a program (e.g., an application), the program counter 210 outputs an initial output address to the memory 220. At this time, when the memory 220 outputs data of a region designated by the output address from the program counter 210, the data alignment unit 250 sequentially aligns the output data from the memory 220. The output data from the data alignment unit 250 is aligned based on the output address from the program counter 210. Exemplary operations of the memory 220 and the data alignment unit 250 were described above with respect to the preferred embodiment of the data alignment system. However, the present invention is not intended to be so limited. For example, more than two memory arrays can be used. The data alignment unit 250 outputs the aligned data to the command decoder 230.

The command decoder 230 interprets only an effective data among the output data received from the data alignment unit 250 and outputs the length value of the interpreted command to the program counter 210. The command execution unit 240 then executes the interpreted command received from the command decoder 230. The program counter 210 increases the previous address, which in this case, is the initial address, by the length of the currently interpreted command. The program counter 210 then preferably outputs the increased address of a next command as a next output address to the memory 220.

At this time, when the memory 220 outputs the data of a region designated by the next output address of the program counter 210, the data alignment unit 250 again sequentially aligns the output data from the memory 220. The command decoder 230 again interprets only the effective data among the output data from the data alignment unit 250. Accordingly, the command decoder 230 outputs the next interpreted command length to the program counter 210 and the next interpreted command.

Again, the program counter 210 increases the previous address by a current interpreted command length to output the next output address of the immediately subsequent command, which is to be output later. The above-described processes are repeatedly performed so that the data stored in the memory 220 is accessed, and the effective command (e.g., having various lengths) is read at one time.

In addition, when the command execution unit 240 executes the commands interpreted by the command decoder 230 and judges a branch address such as a call or a jump, the judged branch address is preferably outputted to the program counter 210. At this time, the program counter 210 outputs the branch address from the command execution unit 240 to the memory 220 irrespective of the address currently being counted. In this case, the command execution unit 240 preferably stores the previous address into an internal register (not shown).

When the memory 220 outputs the data of a region corresponding to the branch address, the data alignment unit 250 sequentially aligns the output data from the memory 220. The command decoder 230 interprets at least the command and the command length among the output data from the data alignment unit 250, and the command execution unit 240 executes the interpreted commands. Thereafter, the program counter 210 repeatedly increases the output address by the extracted command length of commands interpreted by the command decoder 230 after processing the branch address. Thus, the preferred embodiment handles the branch address and extracts the corresponding data from the memory 220.

During operations for extracting the data corresponding to the branch address, a command for returning the current routine to the original routine can be extracted. In this case, the command execution unit 240 outputs the previous address from the internal register (i.e., the address value before the branch address was output to the program counter 210). Then, the program counter 210 outputs the previous address from the command execution unit 240 to the memory 220.

When the memory 220 outputs the corresponding data of the previous address, the data alignment unit 250 and the command decoder 230 operate as described above to compute the address of the data to be subsequently extracted. The above-described operation is repeatedly performed as the command decoder 230 interprets the effective command and outputs the interpreted command length value to the program counter 210. Thus, the effective commands or the variable length commands interpreted by the command decoder 230 are extracted at one time (e.g., one clock period) as shown in FIG. 8.

As described above, preferred embodiments of data access circuits and methods according to the present invention have various advantages. The preferred embodiments can read various length commands at one time. Since a data access circuit for a CPU according to the preferred embodiments can read the commands having various different lengths at one time, it is possible to process at high speed by enhancing the efficiency of the memory or semiconductor device. Further, the length value of the command is preferably indicated in a predetermined portion of the command to judge the length of the currently extracted command. In addition, since an address alignment system provides access to many bytes of continued memory cells for any selected address, it results in the improved data transmission efficiency and memory device utilization efficiency. In particular, when a system according to the preferred embodiments of the present invention is applied to devices such as a main memory device of CPU having various commands with different lengths, the efficiency of address access operation is increased, thus improving the operation speed and the reliability.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A data access circuit for a central processing unit (CPU), comprising:
 a program counter that modifies a current memory address according to a currently decoded command length and computes a next memory address;
 a memory array that outputs a prescribed amount of data responsive to the next memory address from the program counter, wherein the prescribed amount of data is not less than a maximum CPU command length, wherein the memory array comprises two or more memory cell arrays each able to output the prescribed amount of data at one time, wherein the memory array comprises two or more address decoders each connected to a single corresponding one of the memory cell arrays, wherein each of the address decoders receives the next memory address to select up to the prescribed amount of data from the single corresponding memory cell array;

a data alignment device that receives the prescribed amount of data from the memory array and aligns the prescribed amount of data according to the next memory address received from the program counter;

a command decoder that decodes a subset of the aligned prescribed amount of data to output a variable length command and its variable command length, wherein the variable command length is transmitted to the program counter as the currently decoded command length; and a command execution device that receives and executes the variable length command from the command decoder.

2. The data access circuit of claim 1, wherein the two or more memory cell arrays each use a corresponding address decoder to together transmit the prescribed amount of data at one time.

3. The data access circuit of claim 1, wherein the data alignment device repeatedly sequentially aligns (1) a data from a first memory cell array designated by the next memory address from the program counter, and (2) a data from a second memory cell array designated by the next memory address from the program counter.

4. The data access circuit of claim 1, wherein the command execution device outputs a branch address to the program counter.

5. The data access circuit of claim 4, wherein the branch address is at least one of a call command and a jump command, and wherein the command execution device stores the current memory address of the program counter.

6. The data access circuit of claim 1, wherein the program counter receives an initial output address as the current memory address.

7. The data access circuit of claim 1, wherein the variable length commands are individually sequentially processed.

8. The data access circuit of claim 1, wherein the variable length command is extracted in one clock period.

9. The data access circuit of claim 1, wherein the memory array contiguously stores variable length commands in first and second memory cell arrays, and wherein each of the memory cell arrays stores variable length instructions having the maximum CPU command length.

10. The data access circuit of claim 1, wherein the two or more address decoders decode the next memory address to divide m cells of n bit size in the memory array into the two or more memory cell arrays, and individually access the m cells on a block basis.

11. The data access circuit of claim 1, wherein the next memory address is within the prescribed amount of data aligned by the data alignment device according to a previous memory address to selectively repeatedly output data from the memory array to the data alignment device.

12. The data access circuit of claim 1, wherein the first address decoder addresses only the first memory cell array and the second address decoder addresses only the second memory cell array, and wherein the variable command length is in the variable length command.

13. The data access circuit of claim 1, wherein the memory array contiguously stores variable length commands in first and second memory cell arrays, wherein each of the first and second memory cell arrays store variable length instructions having the maximum CPU command length, wherein the next memory address is within the prescribed amount of data aligned by the data alignment device according to a previous memory address to selectively repeatedly output data from the memory array to the data alignment device, and wherein the variable command length is in the variable length command.

14. A method of accessing data for a central processing unit, comprising:

computing an output address based on a previous command length;

decoding the output address at each of a plurality of decoders each connected to a single corresponding one of a plurality of data storage devices to select up to a prescribed amount of data;

outputting the prescribed amount of data from the plurality of data storage devices corresponding to the output address, wherein the prescribed amount of data is not less than a maximum command length, and wherein each of the plurality of data storage devices is able to output the prescribed amount of data;

aligning the prescribed amount of data from the data storing device according to the output address;

decoding a current command length and a current command in order starting from a front portion among the aligned prescribed amount of data, wherein the current command length is variable; and executing the current variable length command decoded from the aligned data, wherein the variable length command is extracted in one clock period, and wherein the output address is recomputed based on the current command length.

15. The method of claim 14, further comprising repeating the decoding through executing steps, and wherein the variable command length is in the variable length command.

16. The method of claim 14, wherein the data storage devices includes two memory cell arrays, and wherein the aligning the output data step comprises:

(a) sequentially aligning a data from a first memory cell array designated by the output address from a program counter;

(b) sequentially aligning a data from a second memory cell array designated by the output address from the program counter; and (c) repeating steps (a) and (b).

17. The method claim 14, wherein the output address is a branch address being one of a call command and a jump command.

18. The method of claim 14, wherein the computing an output address step computes the output address by increasing a previous output address by the previous command length.

19. The method of claim 18, wherein the previous output address is an initial output address.

20. The method of claim 14, wherein the plurality of data storage devices contiguously stores variable length commands in first and second data storage devices, wherein each of the first and second data storage devices store variable length instructions having the maximum CPU command length.

21. A data access circuit for a central processing unit (CPU), comprising:

a program counter that modifies a current memory address according to a currently decoded command length and computes a next memory address;

a memory array that outputs a prescribed amount of data at one time responsive to the next memory address from the program counter, wherein the prescribed amount of data is not less than a maximum CPU command length;

a data alignment device that receives the prescribed amount of data from the memory array and aligns the prescribed amount of data according to the next memory address received from the program counter, wherein the data alignment devices comprises, a plurality of address decoders for decoding a received address, dividing m cells of n bit size in the memory array into at least two blocks, and individually accessing the m cells on a block basis, a controlling circuit for producing data input/output selection signals according to the received address, a plurality of cell selectors connected to cells on the same row of the blocks for selecting cells in any one block in response to the data input/output selection signals produced by the controlling circuit, a plurality of input/output selectors for selecting one of the cell selectors to re-align the prescribed amount of data in the order of addresses according to the data input/output selection signal produced by the controlling circuit, and a plurality of input/output ports each connected to one of the plurality of the input/output selectors;

a command decoder that decodes a subset of the re-aligned prescribed amount of data to output a variable length command and its variable command length, wherein the variable command length is transmitted to the program counter as the currently decoded command length; and a command execution device that receives and executes the variable length command from the command decoder.

* * * * *